United States Patent
Cavanaugh et al.

(10) Patent No.: US 10,124,464 B2
(45) Date of Patent: Nov. 13, 2018

(54) CORROSION INHIBITORS AND RELATED COMPOSITIONS AND METHODS

(71) Applicant: Cabot Microelectronics Corporation, Aurora, IL (US)

(72) Inventors: Mary Cavanaugh, Naperville, IL (US); Steven Kraft, Naperville, IL (US); Andrew Wolff, Darien, IL (US); Phillip W. Carter, Round Lake, IL (US); Elise Sikma, Bartlett, IL (US); Jeffrey Cross, Batavia, IL (US); Benjamin Petro, Aurora, IL (US)

(73) Assignee: Cabot Microelectronics Corporation, Aurora, IL (US)

( * ) Notice: Subject to any disclaimer, the term of this patent is extended or adjusted under 35 U.S.C. 154(b) by 0 days.

(21) Appl. No.: 14/919,404

(22) Filed: Oct. 21, 2015

(65) Prior Publication Data

US 2016/0107289 A1    Apr. 21, 2016

Related U.S. Application Data

(60) Provisional application No. 62/066,484, filed on Oct. 21, 2014, provisional application No. 62/198,013, filed on Jul. 28, 2015.

(51) Int. Cl.
*H01L 21/321* (2006.01)
*B24B 37/24* (2012.01)
(Continued)

(52) U.S. Cl.
CPC .............. *B24B 37/24* (2013.01); *C09D 5/08* (2013.01); *C09G 1/02* (2013.01); *C23F 3/04* (2013.01);
(Continued)

(58) Field of Classification Search
CPC .... C09G 1/02; C09G 1/04; C09G 1/06; C23F 11/00; C23F 11/10; C23F 3/04;
(Continued)

(56) References Cited

U.S. PATENT DOCUMENTS 4,711,735 A    12/1987   Gulley
5,196,353 A     3/1993   Sandhu et al.
(Continued)

FOREIGN PATENT DOCUMENTS

CN    101525563 A    9/2009
CN    101580700 A    11/2009
(Continued)

OTHER PUBLICATIONS

Korean Intellectual Property Office, International Search Report in International Patent Application No. PCT/US2015/056744 (dated Dec. 23, 2015).
(Continued)

*Primary Examiner* — Lan Vinh
(74) *Attorney, Agent, or Firm* — Thomas Omholt; Erika S. Wilson; Salim A. Hasan

(57) ABSTRACT

The invention provides methods of inhibiting corrosion of a substrate containing metal. The substrate can be in any suitable form. In some embodiments, the metal is cobalt. The methods can be used with semiconductor wafers in some embodiments. The invention also provides chemical-mechanical polishing compositions and methods of polishing a substrate. A corrosion inhibitor can be used in the methods and compositions disclosed herein. The inhibitor comprises an amphoteric surfactant, a sulfonate, a phosphonate, a carboxylate, an amino acid derivative, a phosphate ester, an isethionate, a sulfate, a sulfosuccinate, a sulfocinnimate, or any combination thereof.

4 Claims, 3 Drawing Sheets

(51) Int. Cl.
*C09G 1/02* (2006.01)
*C09D 5/08* (2006.01)
*C23F 3/04* (2006.01)
*C23F 3/06* (2006.01)
*C23F 11/10* (2006.01)

(52) U.S. Cl.
CPC ............... *C23F 3/06* (2013.01); *C23F 11/10* (2013.01); *H01L 21/3212* (2013.01)

(58) Field of Classification Search
CPC .. C23F 3/06; C09D 5/08; B24B 37/24; H01L 21/3212; C09K 3/1454
USPC ..... 216/90, 91, 100, 103; 438/692.693, 692, 438/693; 252/79.1, 792
See application file for complete search history.

(56) References Cited

U.S. PATENT DOCUMENTS

| | | | |
|---|---|---|---|
| 5,230,833 | A | 7/1993 | Romberger et al. |
| 5,316,573 | A | 5/1994 | Brusic et al. |
| 5,433,651 | A | 7/1995 | Lustig et al. |
| 5,567,534 | A | 10/1996 | Yano et al. |
| 5,609,511 | A | 3/1997 | Moriyama et al. |
| 5,643,046 | A | 7/1997 | Katakabe et al. |
| 5,658,183 | A | 8/1997 | Sandhu et al. |
| 5,730,642 | A | 3/1998 | Sandhu et al. |
| 5,838,447 | A | 11/1998 | Hiyama et al. |
| 5,872,633 | A | 2/1999 | Holzapfel et al. |
| 5,893,796 | A | 4/1999 | Birang et al. |
| 5,949,927 | A | 9/1999 | Tang |
| 5,964,643 | A | 10/1999 | Birang et al. |
| 6,585,933 | B1 | 7/2003 | Ehrhardt et al. |
| 6,984,340 | B1 | 1/2006 | Brady et al. |
| 7,326,750 | B1* | 2/2008 | Isik ............... C08F 292/00 428/328 |
| 7,931,714 | B2 | 4/2011 | Chang |
| 8,337,716 | B2 | 12/2012 | Chang |
| 8,338,300 | B2 | 12/2012 | Lee et al. |
| 8,641,920 | B2 | 2/2014 | Chang et al. |
| 8,717,710 | B2 | 5/2014 | Dai et al. |
| 8,722,592 | B2 | 5/2014 | Matulewicz et al. |
| 9,039,925 | B2 | 5/2015 | Chen et al. |
| 9,045,717 | B2 | 6/2015 | Nakanishi et al. |
| 2004/0148867 | A1 | 8/2004 | Matsumi |
| 2006/0024967 | A1* | 2/2006 | De Rege Thesauro .. C09G 1/02 438/692 |
| 2006/0068589 | A1* | 3/2006 | Bian ............... C09G 1/02 438/689 |
| 2006/0084260 | A1* | 4/2006 | Boyers ............... C23G 5/00 438/618 |
| 2007/0144915 | A1* | 6/2007 | Tian ............... B23H 5/08 205/640 |
| 2008/0233836 | A1* | 9/2008 | Horikawa ............... C09G 1/02 451/36 |
| 2009/0184287 | A1* | 7/2009 | Chang ............... C09G 1/02 252/79.1 |
| 2010/0029079 | A1 | 2/2010 | Ghosh et al. |
| 2010/0151683 | A1 | 6/2010 | Liu |
| 2010/0163784 | A1 | 7/2010 | Chang et al. |
| 2010/0193728 | A1* | 8/2010 | Chang ............... C09G 1/02 252/79.1 |
| 2011/0100956 | A1* | 5/2011 | Keleher ............... C09G 1/02 216/37 |
| 2011/0152151 | A1* | 6/2011 | Kolics ............... C11D 3/0073 510/175 |
| 2011/0294293 | A1* | 12/2011 | Wang ............... B24B 37/044 438/692 |
| 2012/0052682 | A1* | 3/2012 | Kim ............... C09G 1/02 438/689 |
| 2013/0045598 | A1 | 2/2013 | Guo et al. |
| 2013/0140273 | A1 | 6/2013 | Lu et al. |
| 2013/0153820 | A1* | 6/2013 | Shi ............... C09G 1/02 252/79.1 |
| 2013/0186850 | A1 | 7/2013 | Wang et al. |
| 2013/0261040 | A1 | 10/2013 | Kawada et al. |
| 2014/0004703 | A1 | 1/2014 | Noller et al. |
| 2014/0011361 | A1* | 1/2014 | Reichardt ............... C09G 1/02 438/693 |
| 2014/0199840 | A1 | 7/2014 | Bajaj et al. |
| 2014/0243250 | A1 | 8/2014 | Miller et al. |
| 2014/0303061 | A1* | 10/2014 | Nechyporenko ...... C11D 1/662 510/417 |
| 2015/0152289 | A1 | 6/2015 | Zhang et al. |
| 2016/0020087 | A1* | 1/2016 | Liu ............... C11D 11/0047 510/175 |

FOREIGN PATENT DOCUMENTS

| | | |
|---|---|---|
| JP | 2011-159658 A | 8/2011 |
| KP | 10-2009-0087268 A | 8/2009 |
| KR | 10-2013-0129997 A | 11/2013 |
| TW | I367961 B | 7/2012 |
| TW | 201243039 A | 11/2012 |
| WO | WO 2012/127399 A1 | 9/2012 |

OTHER PUBLICATIONS

Korean Intellectual Property Office, International Search Report in International Patent Application No. PCT/US2015/056749 (dated Jan. 28, 2016).

Korean Intellectual Property Office, International Search Report in International Patent Application No. PCT/US2015/056756 (dated Jan. 28, 2016).

Taiwan Intellectual Property Office, Search Report issued in connection with Taiwan Patent Application No. 104134573 dated Dec. 7, 2016.

Jiang et al., "Synergetic effect of $H_2O_2$ and glycine on cobalt CMP in weakly alkaline slurry," *Microelectronic Engineering*, 122: 82-86 (2014).

Peethala et al., "Cobalt Polishing with Reduced Galvanic Corrosion at Copper/Cobalt Interface Using Hydrogen Peroxide as an Oxidizer in Colloidal Silica-Based Slurries," *Journal of the Electrochemical Society*, 159(6): H582-H588 (2012).

Žerjav et al., "Carboxylic Acids as Corrosion Inhibitors for Cu, Zn and Brasses in Simulated Urban Rain," *International Journal of Electrochemical Science*, 9: 2696-2715 (2014).

* cited by examiner

CORROSION INHIBITORS AND RELATED COMPOSITIONS AND METHODS

CROSS-REFERENCE TO RELATED APPLICATIONS

This patent application claims the benefit of U.S. Provisional Patent Application Nos. 62/066,484, filed Oct. 21, 2014, and 62/198,013, filed Jul. 28, 2015, which are incorporated by reference.

BACKGROUND OF THE INVENTION

Corrosion of metal in the presence of water is a challenging and common problem in a variety of industries. The corrosion can be generalized or localized. Corrosion can be a serious problem as it can cause deterioration of manufactured products by damaging their structure and ultimately even rendering some products useless. Allowing corrosion is not cost efficient and can inhibit productivity. Understanding and preventing corrosion has proven to be a difficult challenge for maintaining infrastructures, machinery, and products subject to corrosion.

For example, one area where corrosion can be an issue is in the fabrication of integrated circuits and other electronic devices. Typically, multiple layers of conducting, semiconducting, and dielectric materials are deposited onto or removed from a substrate surface. As layers of materials are sequentially deposited onto and removed from the substrate, the uppermost surface of the substrate may become nonplanar and require planarization. Planarizing a surface, or "polishing" a surface, is a process whereby material is removed from the surface of the substrate to form a generally even, planar surface. Planarization is useful in removing undesired surface topography and surface defects, such as rough surfaces, agglomerated materials, crystal lattice damage, scratches, and contaminated layers or materials. Planarization is also useful in forming features on a substrate by removing excess deposited material used to fill the features and to provide an even surface for subsequent levels of metallization and processing.

Compositions and methods for planarizing or polishing the surface of a substrate are well known in the art. Chemical-mechanical planarization, or chemical-mechanical polishing (CMP), is a common technique used to planarize substrates. CMP utilizes a chemical composition, known as a CMP composition or more simply as a polishing composition (also referred to as a polishing slurry), for selective removal of material from the substrate. Polishing compositions typically are applied to a substrate by contacting the surface of the substrate with a polishing pad (e.g., polishing cloth or polishing disk) saturated with the polishing composition. The polishing of the substrate typically is further aided by the chemical activity of the polishing composition and/or the mechanical activity of an abrasive suspended in the polishing composition or incorporated into the polishing pad (e.g., fixed abrasive polishing pad).

The chemical-mechanical polishing of cobalt (Co) is becoming increasingly important in advanced circuit integration techniques. Although compositions designed for polishing copper (Cu) are known in the art, these polishing compositions do not always provide a combination of satisfactory polishing performance for cobalt while managing corrosion to desired levels. Copper corrosion inhibitors may not adequately protect the cobalt surface from undesirable chemical attack and etching.

A need remains for methods of inhibiting corrosion of a substrate, including, for example, a substrate that contains cobalt. There is also a need for polishing compositions and methods that provide effective cobalt removal rates, while suppressing the corrosion of cobalt. The invention provides such polishing compositions and methods. These and other advantages of the invention, as well as additional inventive features, will be apparent from the description of the invention provided herein.

BRIEF SUMMARY OF THE INVENTION

In one aspect, the invention provides a method of inhibiting corrosion of a substrate containing metal. The method comprises, consists, or consists essentially of contacting the substrate with an aqueous composition comprising an inhibitor comprising an amphoteric surfactant, a sulfonate, a phosphonate, a carboxylate, an amino acid derivative, a phosphate ester, an isethionate, a sulfate, a sulfosuccinate, a sulfocinnimate, or any combination thereof. In some embodiments, the composition has a pH of from about 3 to about 8.5.

In another aspect, the invention provides a chemical-mechanical polishing composition. The composition comprises, consists, or consists essentially of (a) an abrasive, (b) a rate accelerator, (c) a corrosion inhibitor comprising an amphoteric surfactant, a sulfonate, a phosphonate, a carboxylate, an amino acid derivative, a phosphate ester, an isethionate, a sulfate, a sulfosuccinate, a sulfocinnimate, or any combination thereof, (d) an oxidizing agent, and (e) an aqueous carrier.

In another aspect, the invention provides a method of polishing a substrate. The method comprises, consists, or consists essentially of (i) providing a substrate; (ii) providing a polishing pad; (iii) providing a chemical-mechanical polishing composition; (iv) contacting the substrate with the polishing pad and the chemical-mechanical polishing composition; and (v) moving the polishing pad and the chemical-mechanical polishing composition relative to the substrate to abrade at least a portion of the substrate to polish the substrate. The chemical-mechanical polishing composition can comprise (a) an abrasive, (b) a rate accelerator, (c) a corrosion inhibitor comprising an amphoteric surfactant, a sulfonate, a phosphonate, a carboxylate, an amino acid derivative, a phosphate ester, an isethionate, a sulfate, a sulfosuccinate, a sulfocinnimate, or any combination thereof, (d) an oxidizing agent, and (e) an aqueous carrier.

In another aspect, the invention provides a method of polishing a substrate. The method comprises, consists, or consists essentially of (i) providing a substrate, wherein the substrate comprises a cobalt layer; (ii) providing a polishing pad; (iii) providing a chemical-mechanical polishing composition; (iv) contacting the substrate with the polishing pad and the chemical-mechanical polishing composition; and (v) moving the polishing pad and the chemical-mechanical polishing composition relative to the substrate to abrade at least a portion of the cobalt layer to polish the substrate. The chemical-mechanical polishing composition can comprise (a) an abrasive, (b) a rate accelerator, (c) a corrosion inhibitor comprising an amphoteric surfactant, a sulfonate, a phosphonate, a carboxylate, an amino acid derivative, a phosphate ester, an isethionate, a sulfate, a sulfosuccinate, a sulfocinnimate, or any combination thereof, (d) an oxidizing agent, and (e) an aqueous carrier.

BRIEF DESCRIPTION OF THE SEVERAL VIEWS OF THE DRAWING(S)

DETAILED DESCRIPTION OF THE INVENTION

Method of Inhibiting Corrosion

Figure 1:
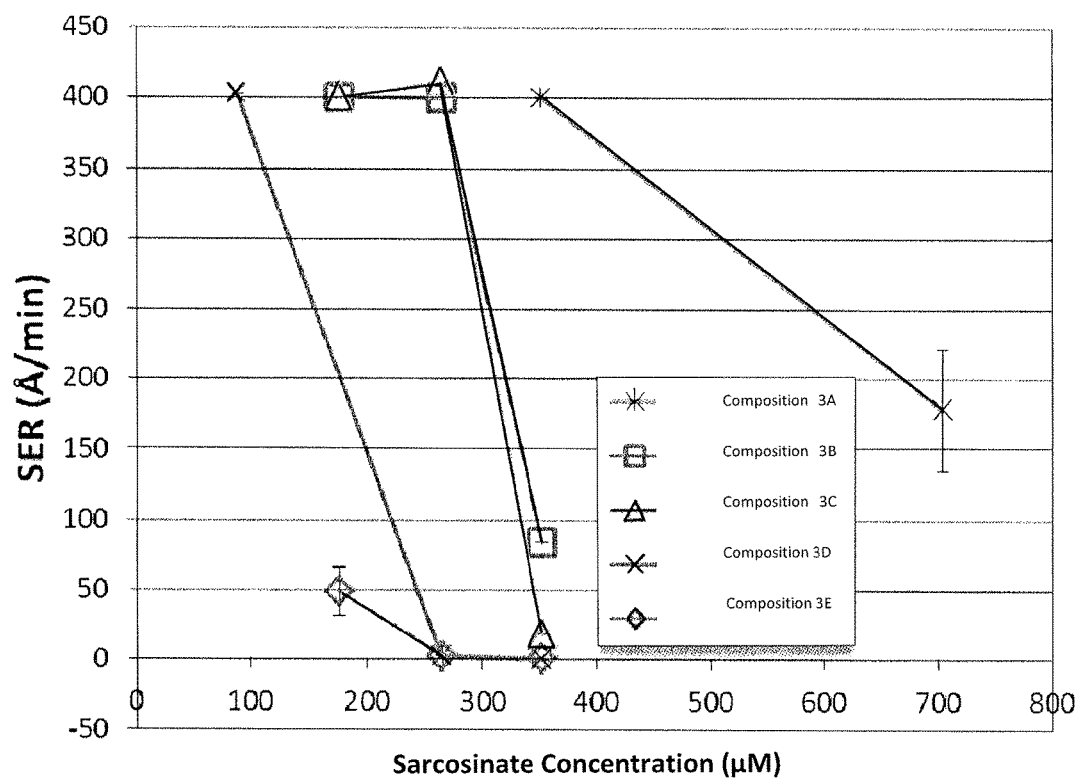
FIG. 1 is a graph of static etch rate (SER) (Y-axis) versus inhibitor concentration (micromolar) of various sarcosinate compounds (X-axis), as described in Example 3 herein.

In one aspect, the invention provides a method of inhibiting corrosion of a substrate containing metal. The method comprises contacting the substrate with an aqueous composition comprising an inhibitor comprising an amphoteric surfactant, a sulfonate, a phosphonate, a carboxylate, an amino acid derivative, a phosphate ester, an isethionate, a sulfate, a sulfosuccinate, a sulfocinnimate, or any combination thereof. Examples of each of these types of ingredients are provided herein and will be readily understood by a person of ordinary skill in the art. In some embodiments, e.g., for applications relating to cobalt-containing substrates, the inhibitor is included in an aqueous composition having a pH of from about 3 to about 8.5. The invention also provides chemical-mechanical polishing compositions and methods of polishing a substrate, as further described herein below.

Substrates

The method of inhibiting corrosion has utility with a variety of metals and can be used in a variety of applications across diverse industries. In some embodiments, the method of inhibiting corrosion can be used where the metal is cobalt or a cobalt-containing alloy. The substrate can be any suitable substrate that needs corrosion inhibition. By way of example, and not intended to be any limitation, the method of inhibiting corrosion can be used in chemical-mechanical polishing as described herein, e.g., where the substrate is a semiconductor wafer embodying integrated circuits or other electronic devices. The wafers typically comprise or consist of, for example, a metal, metal oxide, metal nitride, metal composite, metal alloy, a low dielectric material, or combinations thereof.

However, it will be understood that the method of inhibiting corrosion can be used with other applications, including metal working or metal machining applications. The method of the invention is also useful for polishing substrates comprising cobalt and cobalt alloys useful in turbine blades for gas turbines and jet aircraft engines, orthopedic implants, prosthetic parts such as hip and knee replacements, dental prosthetics, high speed steel drill bits, and permanent magnets.

In embodiments for chemical-mechanical polishing, the methods and compositions of the invention have applicability in polishing a wide variety of semiconductor wafers used in the fabrication of integrated circuits and other microdevices. Such wafers can be of conventional node configurations in some embodiments, e.g., technology nodes of 65 nm or less, 45 nm or less, 32 nm or less, etc. However, in some embodiments, the inventive methods and compositions are particularly suited for advanced node applications (e.g., technology nodes of 22 nm or less, 20 nm or less, 18 nm or less, 16 nm or less, 14 nm or less, 12 nm or less, 10 nm or less, 7 nm or less, 5 nm or less, etc.). It will be understood that, as node technology becomes more advanced, reducing corrosion in planarization technology becomes more important because the effects of corrosion have more of an impact as the relative size of features on the wafer gets smaller. Because of the significant advancement over the art provided by the inventive compositions and methods, e.g., for cobalt or cobalt alloys, more advanced node polishing can be achieved with less corrosion in accordance with some embodiments of the invention. However, as noted, the invention is not limited to use with advanced node wafers and can have a beneficial effect with respect to corrosion for other workpieces as desired.

The methods and compositions of the invention can be used with wafers with copper or other known metal (e.g., aluminum, tungsten, etc.) substrates at conventional or advanced nodes described above. However, the methods and compositions of the invention have a particularly surprising and unexpected benefit for cobalt substrates. In advanced node applications, there is a growing emphasis on cobalt, which is used as an effective interconnect between transistors. Cobalt has been found to provide significant advantages inasmuch as, for example, the cobalt is able to be chemically vapor deposited (CVD) into trenches without defects or serve as a liner around copper wiring.

Chemical-Mechanical Polishing Composition

In another aspect, the invention provides a chemical-mechanical polishing (CMP) composition comprising, consisting, or consisting essentially of (a) an abrasive comprising anionic particles, (b) a rate accelerator, (c) a corrosion inhibitor comprising an amphoteric surfactant, a sulfonate, a phosphonate, a carboxylate, an amino acid derivative, a phosphate ester, an isethionate, a sulfate, a sulfosuccinate, a sulfocinnimate, or any combination thereof, (d) an oxidizing agent, and (e) an aqueous carrier.

While not wishing to be bound by any particular theory, it is believed that the polishing composition of the invention serves to form a two-dimensional film on the substrate surface. The film anchors to and protects the substrate from corrosion. Surprisingly and unexpectedly, the polishing composition of the invention uses an anionic surfactant to passivate a cationically charged surface to protect the substrate from corrosion while in some embodiments also providing desired polishing removal rates. Embodiments of the invention can form a hydrophobic film, e.g., by using a surfactant as a corrosion inhibitor to protect the substrate. Such a film is particularly suitable for protecting cobalt. Whereas conventional systems for protecting copper substrates have formed polymeric complexes (e.g., using an aromatic azole such as benzotriazole (BTA)) with the copper, the invention surprisingly and unexpectedly achieves beneficial corrosion inhibition without forming such a complex and without the use of such an aromatic azole, but rather by forming the two dimensional film noted above. However, it will be appreciated that the polishing composition is not limited to use with cobalt and can be used with other metal substrates, including tungsten, aluminum, copper, and the like. The individual components of the polishing composition are discussed below.

Abrasive Particles

The polishing composition comprises an abrasive (i.e., one or more abrasives). The abrasive can be any suitable abrasive or combination of abrasives in the form of particles. The abrasive particles are desirably anionic in preferred embodiments. For example, the abrasive particles can be alumina particles, silica particles, or a combination thereof.

In some embodiments, the abrasive particles are or include alumina particles, such as alpha alumina particles, where at least a portion of the surface of the alpha alumina particles is coated with a negatively-charged polymer or copolymer. More preferably, the abrasive particles are or include silica particles, such as colloidal silica particles, which are desirably anionic colloidal silica particles.

The abrasive particles can be any suitable alumina particles. For example, the abrasive particles can be alpha alumina particles (i.e., α-alumina), gamma alumina particles (i.e., γ-alumina), delta alumina particles (i.e., δ-alumina), or fumed alumina particles. Alternatively, the abrasive particles can be any suitable alumina particles, wherein the alumina particles do not include one or more of alpha alumina particles, gamma alumina particles, delta alumina particles, and fumed alumina particles.

The abrasive particles can be or include alpha alumina particles in some embodiments. Alpha alumina refers to a crystalline polymorph of aluminum oxide formed at high temperatures above 1400° C. and typically refers to alumina comprising about 50 wt. % or more of the alpha polymorph. Alpha alumina is well known in the art and available commercially in a wide range of particle sizes and surface areas.

In some embodiments, the abrasive comprises alpha alumina particles, and at least a portion of the surface of the alpha alumina particles is coated with a negatively-charged polymer or copolymer. For example, about 5 wt. % or more (e.g., about 10 wt. % or more, about 50 wt. % or more, substantially all, or all) of the surface of the alpha alumina can be coated with a negatively-charged polymer or copolymer. The negatively-charged polymer or copolymer can be any suitable polymer or copolymer. Preferably, the negatively-charged polymer or copolymer comprises repeating units selected from carboxylic acid, sulfonic acid, and phosphonic acid functional groups. More preferably, the negatively-charged polymer or copolymer comprises repeating units selected from acrylic acid, methacrylic acid, itaconic acid, maleic acid, maleic anhydride, vinyl sulfonic acid, 2-(methacryloyloxy)ethanesulfonic acid, styrene sulfonic acid, 2-acrylamido-2-methylpropane sulfonic acid, vinylphosphonic acid, 2-(methacroyloxy)ethylphosphate, and a combination thereof. Most preferably, the negatively-charged polymer or copolymer is poly(2-acrylamido-2-methylpropane sulfonic acid) or polystyrenesulfonic acid. Since alpha alumina particles typically have a positively-charged surface, the association of the polymer or copolymer with alpha alumina particles results in deprotonation of at least part of the acidic functional groups on the polymer or copolymer, thus rendering the polymer or copolymer negatively-charged in association with the alpha alumina particles.

The alumina particles can have any suitable particle size. The particle size of a particle is the diameter of the smallest sphere that encompasses the particle. The particle size of the alumina particles can be measured using any suitable technique, for example, using laser diffraction techniques. Suitable particle size measurement instruments are commercially available, such as from Malvern Instruments (Malvern, UK) and Horiba Scientific (Kyoto, Japan). The alumina particles can have an average particle size of about 10 nm or more, e.g., about 20 nm or more, about 30 nm or more, about 40 nm or more, or about 50 nm or more. Alternatively, or in addition, the alumina particles can have an average particle size of about 1000 nm or less, e.g., about 750 nm or less, about 500 nm or less, about 250 nm or less, about 200 nm or less, about 150 nm or less, or about 100 nm or less. Thus, the alumina particles can have an average particle size within a range bounded by any two of the aforementioned endpoints. For example, the alumina particles can have an average particle size of about 10 nm to about 1000 nm, e.g., about 25 nm to about 750 nm, about 40 nm to about 500 nm, about 50 nm to about 250 nm, about 50 nm to about 150 nm, or about 50 nm to about 125 nm.

In accordance with preferred embodiments, the particles are or include silica particles. For example, the abrasive particles can be colloidal silica particles. Colloidal silica particles typically are non-aggregated, individually discrete particles, which generally are spherical or nearly spherical in shape, but can have other shapes (e.g., shapes with generally elliptical, square, or rectangular cross-sections). Such particles typically are structurally different from fumed particles, which are prepared via a pyrogenic or flame hydrolysis process and are chain-like structures of aggregated primary particles. Alternatively, the abrasive particles can be any suitable silica particles, wherein the silica particles do not include colloidal silica particles.

More preferably, the abrasive particles are colloidal silica particles. Desirably, the colloidal silica particles are precipitated or condensation-polymerized silica, which can be prepared using any method known to those of ordinary skill in the art, such as by the sol gel method or by silicate ion-exchange. Condensation-polymerized silica particles typically are prepared by condensing $Si(OH)_4$ to form substantially spherical particles. The precursor $Si(OH)_4$ can be obtained, for example, by hydrolysis of high purity alkoxysilanes, or by acidification of aqueous silicate solutions. Such abrasive particles can be prepared in accordance with U.S. Pat. No. 5,230,833 or can be obtained as any of various commercially available products such as the Akzo-Nobel BINDZIL™ silica products and Nalco silica products, as well as other similar products available from DuPont, Bayer, Applied Research, Nissan Chemical, Fuso, and Clariant.

The colloidal silica particles can have any suitable surface charge. Preferably, the colloidal silica particles are anionic colloidal silica particles. By "anionic" is meant that the colloidal silica particles have a negative surface charge at the pH of the polishing composition. Colloidal silica particles can be anionic in their natural state at the pH of the polishing composition, or colloidal silica particles can be rendered anionic at the pH of the polishing composition using any method known to those of ordinary skill in the art, such as, for example, by surface metal doping, e.g., by doping with aluminum ions, or by surface treatment with a tethered organic acid, a tethered sulfur-based acid, or a tethered phosphorus-based acid.

The silica particles can have any particle size. The particle size of a particle is the diameter of the smallest sphere that encompasses the particle. The particle size of the silica particles can be measured using any suitable technique, for example, using laser diffraction techniques. Suitable particle size measurement instruments are commercially available, such as from Malvern Instruments (Malvern, UK) and Horiba Scientific (Kyoto, Japan). The silica particles can have an average particle size of about 1 nm or more, e.g., about 2 nm or more, about 4 nm or more, about 5 nm or more, about 10 nm or more, about 20 nm or more, about 25 nm or more, about 50 nm or more, or about 75 nm or more. Alternatively, or in addition, the silica particles can have an average particle size of about 1000 nm or less, e.g., about 750 nm or less, about 500 nm or less, about 300 nm or less, about 250 nm or less, about 120 nm or less, about 150 nm or less, about 100 nm or less, or about 75 nm or less. Thus, the silica particles can have an average particle size within a range bounded by any two of the aforementioned endpoints. For example, the silica particles can have an average particle size of about 1 nm to about 1000 nm, e.g., about 4 nm to about 750 nm, about 10 nm to about 500 nm, about 20 nm to about 300 nm, or about 50 nm to about 120 nm.

The abrasive is present in the polishing composition in any suitable amount. For example, in some embodiments, the abrasive can be included in an amount of about 10 wt. % or less, such as from about 1 wt. % to about 10 wt. %, e.g., from about from about 1 wt. % to about 8 wt. %, from about 1 wt. % to about 6 wt. %, from about 2 wt. % to about 8 wt. %, from about 2 wt. % to about 6 wt. %, etc.

Surprisingly, however, embodiments of the invention allow for unexpectedly low levels of abrasive to achieve desired removal rates without the need for higher amounts of abrasive and mechanical force, particularly in embodiments where the substrates contain cobalt. Thus, in some embodiments, the abrasive is included in a concentration of from about 0.05 wt. % to about 1 wt. %, e.g., from about 0.05 wt. % to about 1 wt. %, from about 0.05 wt. % to about 0.8 wt. %, from about 0.05 wt. % to about 0.6 wt. %, from about 0.05 wt. % to about 0.4 wt. %, from about 0.05 wt. % to about 0.2 wt. %, from about 0.1 wt. % to about 1 wt. %, from about 0.1 wt. % to about 0.8 wt. %, from about 0.1 wt. % to about 0.6 wt. %, from about 0.1 wt. % to about 0.4 wt. %, from about 0.2 wt. % to about 1 wt. %, from about 0.2 wt. % to about 0.8 wt. %, from about 0.2 wt. % to about 0.6 wt. %, from about 0.2 wt. % to about 0.4 wt. %, from about 0.4 wt. % to about 1 wt. %, from about 0.4 wt. % to about 0.8 wt. %, from about 0.4 wt. % to about 0.6 wt. %, etc.

Corrosion Inhibitor

In accordance with preferred embodiments, the corrosion inhibitor (e.g., for cobalt or for other metal) is one or more of an amphoteric surfactant, a sulfonate, a phosphonate, a carboxylate, an amino acid derivative (e.g., an amino acid amide such as a fatty acid amino acid amide), a phosphate ester, an isethionate, a sulfate, a sulfosuccinate, a sulfocinnimate, or any combination thereof. In some embodiments, the corrosion inhibitor is considered a surfactant because it has a hydrophilic head group and hydrophobic tail, rendering it surface active.

In some embodiments, the corrosion inhibitor is characterized by the formula: $X—R_2$, where X=anionic head group and $R_2$=an aliphatic group of carbon number n. In some embodiments, n is greater than 7. In some embodiments, n is from about 12 to about 24 (e.g., about 12 to about 22, about 12 to about 20, about 12 to about 18, about 12 to about 16, or about 12 to about 14). However, in some embodiments, n can be lower if desired (e.g., from about 8 to about 24). X can be any suitable anionic head group, such as an amino acid derivative, a phosphate ester, an isethionate, a sulfate, a sulfosuccinate, a sulfocinnimate, sulfonate, phosphonate, etc.

In an embodiment, the corrosion inhibitor comprises an anionic head group and an aliphatic tail group, e.g., a $C_8$-$C_{24}$ aliphatic tail group, such as a $C_{10}$-$C_{22}$, $C_{10}$-$C_{20}$, $C_{10}$-$C_{18}$, $C_{10}$-$C_{16}$, $C_{10}$-$C_{14}$, or $C_{12}$-$C_{14}$ aliphatic tail group. In an embodiment, the corrosion inhibitor (e.g., for cobalt) comprises an anionic head group and a $C_9$-$C_{14}$ aliphatic tail group, for example, a $C_9$-$C_{14}$ alkyl or a $C_9$-$C_{14}$ alkenyl tail group. It will be understood that, as defined herein throughout, "aliphatic" refers to alkyl, alkenyl, or alkynl, and can be substituted or unsubstituted, and saturated or unsaturated, e.g., stearyl, oleyl, linoleyl, or linolenyl are all $C_{18}$ aliphatic groups. The term aliphatic thus also refers to chains with heteroatom substitution that preserves the hydrophobicity of the group. The corrosion inhibitor can be a single compound, or can be a combination of two or more compounds.

In a preferred embodiment, the corrosion inhibitor (e.g., for cobalt) is or comprises a sarcosine derivative having the structure: $R—CON(CH_3)CH_2COOH$ wherein $CON(CH_3)CH_2COOH$ forms the head group and R forms the tail group. In some embodiments, the R group is a $C_8$-$C_{20}$ aliphatic group and can be a $C_9$-$C_{20}$ alkyl group or a $C_9$-$C_{20}$ alkenyl group, for example, a $C_9$ alkyl group, $C_{10}$ alkyl group, $C_{11}$ alkyl group, $C_{12}$ alkyl group, $C_{13}$ alkyl group, $C_{14}$ alkyl group, $C_{15}$ alkyl group, $C_{16}$ alkyl group, $C_{17}$ alkyl group, $C_{18}$ alkyl group, $C_{19}$ alkyl group, $C_{20}$ alkyl group, $C_9$ alkenyl group, $C_{10}$ alkenyl group, $C_{11}$ alkenyl group, $C_{12}$ alkenyl group, $C_{13}$ alkenyl group, $C_{14}$ alkenyl group, $C_{15}$ alkenyl group, $C_{16}$ alkenyl group, $C_{17}$ alkenyl group, $C_{18}$ alkenyl group, $C_{19}$ alkenyl group, or $C_{20}$ alkenyl group. Thus, for example, the R group can be a $C_9$-$C_{14}$ aliphatic group, $C_{13}$-$C_{20}$ aliphatic group, or $C_{15}$-$C_{17}$ aliphatic group.

In a preferred embodiment wherein the corrosion inhibitor (e.g., for cobalt) is a sarcosine derivative, conventional naming of the tail group includes the carbonyl to which the R group is attached for carbon counting purposes. Thus, to illustrate, a $C_{12}$ sarcosinate refers to a lauroyl sarcosinate, and a $C_{18}$ sarcosinate refers to, for example a stearoyl sarcosinate or an oleoyl sarcosinate.

When the tail group is an alkenyl group, wherein the double bond is not at the terminus of the tail group, the alkenyl group can have the E configuration or the Z configuration, or can be a mixture of E and Z isomers. The corrosion inhibitor can be a single compound, or can be a mixture of two or more compounds having an anionic head group and a $C_8$-$C_{20}$ aliphatic tail group or a mixture of two or more sarcosine derivatives as described herein having an $C_7$-$C_{19}$ aliphatic R group, provided that about 75 wt. % or more (e.g., about 80 wt. % or more, about 85 wt. % or more, about 90 wt. % or more, or about 95 wt. % or more) of the compounds comprise an anionic head group and a $C_{10}$-$C_{14}$ aliphatic tail group or are sarcosine derivatives having $C_9$-$C_{13}$ aliphatic R groups. It will be appreciated that, depending on the pH of the polishing composition, the aforementioned sarcosine derivatives can exist in the form of a salt (e.g., a metal salt, an ammonium salt, or the like), an acid, or as a mixture of an acid and a salt thereof. The acid or salt forms or mixtures thereof of the sarcosine derivatives are suitable for use in the preparation of the polishing composition.

In some embodiments, the corrosion inhibitor can be or includes anionic surfactant including, for example, a suitable amino acid derivative, such as an amino acid amide and/or fatty acid amino acid, particularly fatty acid amino acid amines. In some embodiments, the amino acid derivative is in the form of fatty acid derivatives of sarcosine, including salts thereof, i.e., sarcosinates as described above. Examples of sarcosinates, include, for example, N-cocoyl sarcosinate, N-lauroyl sarcosinate, N-stearoyl sarcosinate, N-oleoyl sarcosinate, N-myristoyl sarcosinate, N-cocoyl sarcosinate, N-myristoyl sarcosinate, potassium N-lauroyl sarcosinate, salts thereof, or any combination thereof.

In some embodiments, the amino acid derivative is an amino acid amide in the form of a fatty acid amino acid amide that is or includes a glycine derivative, such as, for example, fatty acid amino acid amides such as a $C_8$-$C_{18}$ glycine (e.g., $C_8$-$C_{18}$ aliphatic glycine, such as $C_8$-$C_{16}$, $C_{10}$-$C_{14}$, $C_{10}$-$C_{12}$, $C_{12}$-$C_{16}$, $C_{12}$-$C_{18}$ aliphatic glycine, etc.). Examples include N-lauroyl glycine, N-myristoyl glycine, N-palmitoyl glycine, or a combination thereof.

In some embodiments, the amino acid derivative is an amide in the form of a fatty acid amino acid that comprises an alaninate compound such as a $C_8$-$C_{18}$ alaninate (e.g., $C_8$-$C_{18}$ aliphatic alaninate, such as $C_8$-$C_{16}$, $C_{10}$-$C_{14}$, $C_{10}$-$C_{12}$, $C_{12}$-$C_{16}$, $C_{12}$-$C_{18}$ aliphatic alaninates, etc.), such as N-lauroyl alaninate, N-myristoyl alaninate, potassium N-cocoyl alaninate, any salt thereof, or any combination thereof. In some embodiments, the amino acid derivative is an amino acid amide in the form of a fatty acid amino acid amide that comprises a glutamate compound such as a $C_8$-$C_{18}$ glutamate (e.g., $C_8$-$C_{18}$ aliphatic glutamate, such as $C_8$-$C_{16}$, $C_{14}$, $C_{10}$-$C_{12}$, $C_{12}$-$C_{16}$, $C_{12}$-$C_{18}$ aliphatic glutamates, etc.), such as N-lauroyl glutamate, N-cocoyl glutamate, potassium N-cocoyl glutamate, any salt thereof, or any combination thereof.

The corrosion inhibitor can be or include other anionic surfactants, such as one or more of a phosphate ester, an isethionate, a sulfosuccinate, a sulfocinnimate, a sulfate, etc. Phosphate esters are desirable as corrosion inhibitors because they are characterized by phosphate, an anionic head group attached to an aliphatic chain through zero, one, or more ethylene glycol units. Any suitable phosphate ester can be utilized to inhibit cobalt corrosion, including, for example, a $C_8$-$C_{18}$ aliphatic phosphate ester, such as $C_8$-$C_{16}$, $C_{10}$-$C_{14}$, $C_{10}$-$C_{12}$, $C_{12}$-$C_{16}$, $C_{12}$-$C_{18}$ aliphatic phosphate ester, e.g., a $C_{18}$ alkenyl phosphate ester such as oleyl phosphate ester, oleth-3-phosphate ester, oleth-10-phosphate ester, or any combination thereof.

The corrosion inhibitor can be or include a carboxylate compound in some embodiments. As defined herein, a carboxylate includes carboxylic acids as it will be appreciated that, depending on the pH of the polishing composition, such compounds can exist in the form of a salt (e.g., a metal salt, an ammonium salt, or the like), an acid, or as a mixture of an acid and a salt thereof. The acid or salt forms or mixtures thereof of such compounds are suitable for use in the preparation of the polishing composition. Any suitable carboxylic acid can be utilized, including, for example, a $C_8$-$C_{18}$ carboxylic acid (e.g., $C_8$-$C_{18}$ aliphatic carboxylic acid, such as $C_8$-$C_{16}$, $C_{10}$-$C_{14}$, $C_{10}$-$C_{12}$, $C_{12}$-$C_{16}$, $C_{12}$-$C_{18}$ aliphatic carboxylic acids, etc.), including, for example, decanoic acid, dodecanoic acid, myristic acid, palmitic acid, any salt thereof, any structural isomer thereof, or any combination thereof. A structural isomer as defined herein will be understood to refer to an aliphatic group with the same empirical formula but differing connectivity. For example, the 3-ethyldecyl group is a structural isomer of the n-dodecyl group.

A phosphonate compound is another suitable type of desired corrosion inhibitor (alone or in combination with others) in accordance with embodiments of the invention. As defined herein, a phosphonate includes phosphonic acids as it will be appreciated that, depending on the pH of the polishing composition, such compounds can exist in the form of a salt (e.g., a metal salt, an ammonium salt, or the like), an acid, or as a mixture of an acid and a salt thereof. The acid or salt forms or mixtures thereof of such compounds are suitable for use in the preparation of the polishing composition. Any suitable phosphonic acid can be utilized, including, for example, a $C_8$-$C_{18}$ phosphonate (e.g., $C_8$-$C_{18}$ aliphatic phosphonate such as $C_8$-$C_{16}$, $C_{10}$-$C_{14}$, $C_{10}$-$C_{12}$, $C_{12}$-$C_{16}$, $C_{12}$-$C_{18}$ aliphatic phosphonates, etc.), such as octylphosphonic acid, tetradecylphosphonic acid, hexadecylphosphonic acid, any structural isomer thereof, or any combination thereof. A structural isomer of such phosphonates as defined herein will be understood to refer to an aliphatic phosphonate in which an aliphatic group with the same empirical formula but differing connectivity is available. For example, the 3-ethyldecylphosphonate is a structural isomer of n-dodecylphosphonate.

In some embodiments, the inhibitor can be or includes a sulfonate compound. For example, the sulfonate can be a sulfonic acid (under similar salt-acid forms described above for carboxylates and phosphonates), an aliphatic sulfonate, for example, a $C_8$-$C_{18}$ sulfonate (e.g., $C_8$-$C_{16}$, $C_{10}$-$C_{14}$, $C_{10}$-$C_{12}$, $C_{12}$-$C_{16}$, $C_{12}$-$C_{18}$ aliphatic sulfonates, etc.), including, for example, 1-hexadecanesulfonate, an olefin sulfonate, or a combination thereof. The olefin sulfonate, e.g., alkenyl sulfonate, can have any suitable alkenyl group, for example a $C_8$-$C_{24}$ alkenyl group, such as a $C_{10}$-$C_m$ alkenyl group, $C_{12}$-$C_{18}$ alkenyl group, $C_{14}$-$C_{16}$ alkenyl group, etc. In some embodiments, the sulfonate can be a non-metallic complex salt alkyl sulfonate or metal salt alkyl sulfonate, e.g., a $C_{14\text{-}17}$ sec-alkyl sulfonate salt, or structural isomers of sec-alkyl sulfonates, i.e., linear alkyl sulfonates. The salt can be formed from a non-metallic complex ion such as ammonium, alkyl-ammonium, or any suitable metal such as, for example, potassium, cesium, sodium, lithium, etc.

In one embodiment, the corrosion inhibitor comprises, consists essentially of, or consists of an amphoteric surfactant. The amphoteric surfactant can be any suitable amphoteric surfactant. For example, the amphoteric surfactant can be a sodium laurimino dipropionate or a betaine, such as a $C_{12}$-$C_{14}$-alkyldimethyl-betaine. Suitable amphoteric surfactants are commercially available, for example, from Rhodia (e.g., MIRATAINE™ H2C-HA) and Sigma-Aldrich (e.g., EMPIGEN™ BB). Alternatively, the amphoteric surfactant can be any suitable amphoteric surfactant, wherein the amphoteric surfactant does not include one or more of a sodium laurimino dipropionate and a betaine.

In some embodiments, the polishing composition, or other inhibitor-containing composition, is substantially free of an aromatic azole, such as benzotriazole (BTA). As used herein, "substantially free" of an aromatic azole such as BTA means that inhibitor-containing composition contains 0 wt. % based on the weight of the composition, or no such aromatic azole such as BTA, or an ineffective or immaterial amount of such aromatic azole. An example of an ineffective amount is an amount below the threshold amount to achieve the intended purpose of using such aromatic azole such as BTA. An immaterial amount may be, for example, below about 0.01 wt. %.

The corrosion inhibitor can have any suitable molecular weight. In some embodiments, the desired corrosion inhibitors can be selected to have a molecular weight of from about 60 g/mol to about 500 g/mol, such as from about 60 g/mol to about 450 g/mol, from about 60 g/mol to about 400 g/mol, from about 60 g/mol to about 350 g/mol, from about 60 g/mol to about 300 g/mol, from about 60 g/mol to about 250 g/mol, from about 60 g/mol to about 200 g/mol, from about 60 g/mol to about 150 g/mol, from about 60 g/mol to about 100 g/mol, from about 100 g/mol to about 500 g/mol from about 100 g/mol to about 450 g/mol, from about 100 g/mol to about 400 g/mol, from about 100 g/mol to about 400 g/mol, from about 100 g/mol to about 350 g/mol, from about 100 g/mol to about 300 g/mol, from about 100 g/mol to about 250 g/mol, from about 100 g/mol to about 200 g/mol, from about 100 g/mol to about 150 g/mol, from about 150 g/mol to about 500 g/mol from about 150 g/mol to about 450 g/mol, from about 150 g/mol to about 350 g/mol, from about 150 g/mol to about 300 g/mol, from about 150 g/mol to about 250 g/mol, from about 200 g/mol to about 500 g/mol, from about 200 g/mol to about 450 g/mol, from about 200 g/mol to about 400 g/mol, from about 200 g/mol to about 350 g/mol, 200 g/mol to about 300 g/mol, etc.

Table 1 summarizes examples of representative corrosion inhibitors in accordance with embodiments of the invention.

TABLE 1

| Inhibitor | Average Molecular Weight (g/mol) | Category |
|---|---|---|
| N-cocoyl sarcosinate | 284 | Fatty acid amino acid amide |
| N-lauroyl sarcosinate | 271 | Fatty acid amino acid amide |
| N-stearoyl sarcosinate | 356 | Fatty acid amino acid amide |
| N-oleoyl sarcosinate | 354 | Fatty acid amino acid amide |
| N-myristoyl sarcosinate | 321 | Fatty acid amino acid amide |
| N-lauroyl glycine | 257 | Fatty acid amino acid amide |
| N-myristoyl glycine | 307 | Fatty acid amino acid amide |
| decanoic acid | 172 | Carboxylate |
| N-palmitoyl glycine | 313 | Fatty acid amino acid amide |
| dodecanoic acid | 200 | Carboxylate |
| myristic acid | 228 | Carboxylate |
| N-lauroyl glutamate | 351 | Fatty acid amino acid amide |
| palmitic acid | 256 | Carboxylate |
| N-cocoyl glutamate, K + salt | 380 | Fatty acid amino acid amide |
| octylphosphonic acid | 194 | Phosphonate |
| tetradecylphosphonic acid | 278 | Phosphonate |
| hexadecylphosphonic acid | 306 | Phosphonate |
| 1-hexadecanesulfonic acid sodium salt | 328 | Sulfonate |
| sodium olefin sulfonate | 314 | Sulfonate |

The corrosion inhibitor can be included in the composition in any suitable amount. For example, in some embodiments, the inhibitor is present in an amount of about 0.0025 wt. % or more, e.g., about 0.004 wt. % or more, about 0.005 wt. % or more, about 0.01 wt. % or more, about 0.05 wt. % or more, about 0.075 wt. % or more, about 0.1 wt. % or more, or about 0.25 wt. % or more. Alternatively, or in addition, the corrosion inhibitor can be present in the polishing composition at a concentration of about 1 wt. % or less, e.g., about 0.75 wt. % or less, about 0.5 wt. % or less, about 0.25 wt. % or less, or about 0.1 wt. % or less. Thus, the corrosion inhibitor can be present in the polishing composition at a concentration within a range bounded by any two of the aforementioned endpoints. Preferably, the corrosion inhibitor is present in the polishing composition at a concentration of about 0.004 wt. % to about 0.25 wt. %, e.g., about 0.004 wt. % to about 0.2 wt. %, about 0.004 wt. % to about 0.010 wt. %, about 0.004 wt. % to about 0.008 wt. %, about 0.005 wt. % to about 0.15 wt. %, about 0.006 wt. % to about 0.010 wt. %, about 0.0075 wt. % to about 0.1 wt. %, about 0.01 wt. % to about 0.1 wt. %, or about 0.05 wt. % to about 0.1 wt. %, etc.

Rate Accelerator

The polishing composition can include a suitable rate accelerator. A rate accelerator is a substance or a combination of substances that improves the rate of removal of a material from a substrate by the polishing composition. The rate accelerator can be or include, for example, a cationic rate accelerator, zwitterionic rate accelerator, anionic rate accelerator, or any combination thereof. In some embodiments, the rate accelerator comprises, consists of, or consists essentially of an anionic rate accelerator. For example, in some embodiments, the rate accelerator can include a phosphonic acid, an N-heterocyclic compound, or a combination thereof.

In some embodiments, the rate accelerator can be selected from a compound having the formula: $NR^1R^2R^3$ wherein $R^1$, $R^2$, and $R^3$ are independently selected from hydrogen, carboxyalkyl, substituted carboxyalkyl, hydroxyalkyl, substituted hydroxyalkyl and aminocarbonylalkyl, wherein none or one of $R^1$, $R^2$, and $R^3$ are hydrogen; dicarboxyheterocycles; heterocyclylalkyl-α-amino acids; N-(amidoalkyl) amino acids; unsubstituted heterocycles; alkyl-substituted heterocycles; substituted-alkyl-substituted heterocycles; and N-aminoalkyl-α-amino acids.

The rate accelerator can be any suitable rate accelerator selected from the classes of compounds recited herein. In preferred embodiments, the rate accelerator is iminodiacetic acid, 2-[bis(2-hydroxyethyl)amino]-2-(hydroxymethyl)-1,3-propanediol, bicine, dipicolinic acid, histidine, [(2-amino-2-oxoethyl)amino]acetic acid, imidazole, N-methylimidazole, lysine, or combinations thereof.

In a preferred embodiment, the rate accelerator comprises, consists essentially of, or consists of a phosphonic acid. The phosphonic acid can be any suitable phosphonic acid. Preferably, the phosphonic acid is an amino tri(methylene phosphonic acid) or a 1-hydroxyethylidene-1,1,-diphosphonic acid. Suitable phosphonic acids are commercially available, for example, from Italmatch Chemicals (e.g., DEQUEST™ 2000 and DEQUEST™ 2010). Alternatively, the phosphonic acid can be any suitable phosphonic acid, wherein the phosphonic acid does not include one or more of an amino tri(methylene phosphonic acid) and a 1-hydroxyethylidene-1,1,-diphosphonic acid.

In another preferred embodiment, the rate accelerator comprises, consists essentially of, or consists of an N-heterocyclic compound. The N-heterocyclic compound can be any suitable N-heterocyclic compound. Preferably, the N-heterocyclic compound is picolinic acid, L-histidine, 2-mercapto-1-methylimidazole, or imidazole. Alternatively, the N-heterocyclic compound can be any suitable N-heterocyclic compound, wherein the N-heterocyclic compound does not include one or more of picolinic acid, 2-mercapto-1-methylimidazole, and imidazole.

The rate accelerator (for cobalt or other metal) can be present in the polishing composition in any suitable concentration. In some embodiments, the rate accelerator can be present in the polishing composition at a concentration of about 0.05 wt. % or more, e.g., about 0.075 wt. % or more, about 0.1 wt. % or more, about 0.15 wt. % or more, about 0.2 wt. % or more, about 0.25 wt. % or more, about 0.5 wt. % or more, or about 0.75 wt. % or more. Alternatively, or in addition, the rate accelerator can be present in the polishing composition at a concentration of about 8 wt. % or less, e.g., about 7 wt. % or less, about 6 wt. % or less, about 5 wt. % or less, about 4 wt. % or less, about 3 wt. % or less, about 2 wt. % or less, or about 1 wt. % or less. Thus, the rate accelerator can be present in the polishing composition at a concentration within a range bounded by any two of the aforementioned endpoints.

Preferably, the rate accelerator is present in the polishing composition at a concentration of about 0.05 wt. % to about 5 wt. %, e.g., about 0.05 wt. % to about 3 wt. %, 0.2 wt. % to about 1 wt. %, or about 0.1 wt. % to about 2 wt. %.

Other Components of the CMP Composition

In some embodiments, the polishing composition comprises an oxidizing agent that oxidizes metal, such as, but not limited to, cobalt. The oxidizing agent can be any suitable oxidizing agent having an oxidation potential of sufficient magnitude at the pH of the polishing composition to oxidize cobalt. In a preferred embodiment, the oxidizing agent is hydrogen peroxide. Other examples of suitable oxidizing agents include persulfate salts (e.g., ammonium persulfate), ferric salts (e.g., ferric nitrate), inorganic peroxides, organic peroxides, and combinations thereof. Inorganic peroxides include sodium percarbonate, calcium peroxide, and magnesium peroxide. The oxidizing agent can comprise, consist essentially of, or consist of one or more of the aforementioned examples of suitable oxidizing agents.

The polishing composition can comprise any suitable amount of the oxidizing agent. For example, the oxidizing agent can be present in the polishing composition at a concentration of about 0.1 wt. % to about 5 wt. %, e.g., about 0.2 wt. % to about 5 wt. %, about 0.3 wt. % to about 5 wt. %, or about 0.3 wt. % to about 3 wt. %. In some embodiments, the oxidizing agent is present in the polishing composition at a concentration of about 0.2 wt. % to about 2 wt. %, e.g., about 0.3 wt. % to about 1.8 wt. %, or about 0.6 wt. % to about 1.2 wt. %.

The polishing composition optionally further comprises an ethylene oxide/propylene oxide block copolymer. Without wishing to be bound by theory, it is believed that the ethylene oxide/propylene oxide block copolymer functions as a suppressant of dielectric removal. In particular, it is believed that the ethylene oxide/propylene oxide block copolymer functions as a suppressant of black diamond (BD) removal.

The ethylene oxide/propylene oxide block copolymer can be any suitable ethylene oxide/propylene oxide block copolymer. For example, the ethylene oxide/propylene oxide block copolymer can be a difunctional block copolymer surfactant terminating in primary hydroxyl groups. Suitable ethylene oxide/propylene oxide block copolymers are commercially available, for example, from BASF Corporation (e.g., the PLURONIC™ series of products, including PLURONIC™ F108). Alternatively, the ethylene oxide/propylene oxide block copolymer can be any suitable ethylene oxide/propylene oxide block copolymer, wherein the ethylene oxide/propylene oxide block copolymer does not include a difunctional block copolymer surfactant terminating in primary hydroxyl groups.

The ethylene oxide/propylene oxide block copolymer can be present in the polishing composition at any suitable concentration. For example, the ethylene oxide/propylene oxide block copolymer can be present in the polishing composition at a concentration of about 0.001 wt. % or more, e.g., about 0.005 wt. % or more, about 0.0075 wt. % or more, about 0.01 wt. % or more, about 0.05 wt. % or more, or about 0.1 wt. % or more. Alternatively, or in addition, the ethylene oxide/propylene oxide block copolymer can be present in the polishing composition at a concentration of about 1 wt. % or less, e.g., about 0.75 wt. % or less, about 0.5 wt. % or less, about 0.25 wt. % or less, or about 0.1 wt. % or less. Thus, the ethylene oxide/propylene oxide block copolymer can be present in the polishing composition at a concentration within a range bounded by any two of the aforementioned endpoints. Preferably, the ethylene oxide/propylene oxide block copolymer is present in the polishing composition at a concentration of about 0.005 wt. % to about 0.1 wt. %, e.g., about 0.0075 wt. % to about 0.1 wt. %, about 0.01 wt. % to about 0.1 wt. %, or about 0.05 wt. % to about 0.1 wt. %.

The polishing composition optionally further comprises a polymeric stabilizer. The polymeric stabilizer can be any suitable stabilizer. Preferably, the polymeric stabilizer is polyacrylic acid. Alternatively, the polymeric stabilizer can be any suitable stabilizer, wherein the polymeric stabilizer does not include polyacrylic acid. The polymeric stabilizer can be present in the polishing composition at any suitable concentration. For example, the polymeric stabilizer can be present in the polishing composition at a concentration of about 0.01 wt. % to about 1 wt. %, e.g., about 0.025 wt. % to about 0.5 wt. %, or about 0.025 wt. % to about 0.1 wt. %. Preferably, the polymeric stabilizer is present in the polishing composition at a concentration of about 0.025 wt. % to about 0.075 wt. %, e.g., about 0.05 wt. %.

Desirably, in embodiments where cobalt is the substrate, the chemical-mechanical polishing composition has a pH of from about 3 to about 8.5. While not wishing to be bound by any particular theory, it is believed that at pH above 8.5, the cobalt oxide surface becomes negatively charged, and inhibitors are less effective because of the anionic oxide surface charge is repulsive to anionic inhibitor molecules. The pH of the polishing composition for use with cobalt is desirably not below 3 because of the relative surface instability with respect to cobalt dissolution at a pH below 3. However, other pH's are possible depending on the substrate. For example, the polishing composition for copper can have a pH of from about 3 to about 7, and the polishing composition for tungsten can have a pH of from about 2 to about 4. In some embodiments, the polishing composition optionally comprises ammonium hydroxide or other buffering agent as known to assist in achieving the desired pH.

The polishing composition optionally further comprises one or more additives. Illustrative additives include conditioners, acids (e.g., sulfonic acids), complexing agents (e.g., anionic polymeric complexing agents), chelating agents, biocides, scale inhibitors, dispersants, etc.

A biocide, when present, can be any suitable biocide and can be present in the polishing composition in any suitable amount. A suitable biocide is an isothiazolinone biocide. The amount of biocide in the polishing composition typically is about 1 ppm to about 50 ppm, preferably about 10 ppm to about 30 ppm.

Preparation of the CMP Composition

The polishing composition can be prepared by any suitable technique, many of which are known to those skilled in the art. The polishing composition can be prepared in a batch or continuous process. Generally, the polishing composition can be prepared by combining the components thereof in any order. The term "component" as used herein includes individual ingredients (e.g., abrasive, rate accelerator, corrosion inhibitor, oxidizing agent, etc.) as well as any combination of ingredients (e.g., abrasive, rate accelerator, corrosion inhibitor, oxidizing agent, etc.).

For example, the abrasive can be dispersed in water. The rate accelerator and corrosion inhibitor can then be added, and mixed by any method that is capable of incorporating the components into the polishing composition. The oxidizing agent can be added at any time during the preparation of the polishing composition. The polishing composition can be prepared prior to use, with one or more components, such as the oxidizing agent, added to the polishing composition just before use (e.g., within about 1 minute before use, or within about 1 hour before use, or within about 7 days before use). The polishing composition also can be prepared by mixing the components at the surface of the substrate during the polishing operation.

The polishing composition can be supplied as a one-package system comprising abrasive, rate accelerator, corrosion inhibitor, oxidizing agent, water, etc. Alternatively, the abrasive can be supplied as a dispersion in water in a first container, and the rate accelerator, corrosion inhibitor, oxidizing agent, and other ingredients as desired can be supplied in a second container, either in dry form, or as a solution or dispersion in water. The oxidizing agent desirably is supplied separately from the other components of the polishing composition and is combined, e.g., by the end-user, with the other components of the polishing composition shortly before use (e.g., 1 week or less prior to use, 1 day or less prior to use, 1 hour or less prior to use, 10 minutes or less prior to use, or 1 minute or less prior to use). The components in the first or second container can be in dry form while the components in the other container can be in the form of an aqueous dispersion. Moreover, it is suitable for the components in the first and second containers to have different pH values, or alternatively to have substantially similar, or even equal, pH values. Other two-container, or three or more-container, combinations of the components of the polishing composition are within the knowledge of one of ordinary skill in the art.

The polishing composition of the invention also can be provided as a concentrate which is intended to be diluted with an appropriate amount of water prior to use. In such an embodiment, the polishing composition concentrate can comprise the abrasive, rate accelerator, corrosion inhibitor, and other ingredients as desired, with or without the oxidizing agent, in amounts such that, upon dilution of the concentrate with an appropriate amount of water, and the oxidizing agent if not already present in an appropriate amount, each component of the polishing composition will be present in the polishing composition in an amount within the appropriate range recited above for each component. For example, the abrasive, rate accelerator, corrosion inhibitor, and other ingredients as desired can each be present in the concentration in an amount that is about 2 times (e.g., about 3 times, about 4 times, or about 5 times) greater than the concentration recited above for each component so that, when the concentrate is diluted with an equal volume of (e.g., 2 equal volumes of water, 3 equal volumes of water, or 4 equal volumes of water, respectively), along with the oxidizing agent in a suitable amount, each component will be present in the polishing composition in an amount within the ranges set forth above for each component. Furthermore, as will be understood by those of ordinary skill in the art, the concentrate can contain an appropriate fraction of the water present in the final polishing composition in order to ensure that other components are at least partially or fully dissolved in the concentrate.

Method of Polishing a Substrate

In another aspect, the invention provides a method of polishing a substrate comprising, consisting of, or consisting essentially of (i) providing a substrate, (ii) providing a polishing pad, (iii) providing the chemical-mechanical polishing composition, (iv) contacting the substrate with the polishing pad and the chemical-mechanical polishing composition, and (v) moving the polishing pad and the chemical-mechanical polishing composition relative to the substrate to abrade at least a portion of the substrate to polish the substrate. The polishing composition comprises, consists, or consists essentially of (a) an abrasive comprising anionic particles, (b) a rate accelerator, (c) a corrosion inhibitor comprising an amphoteric surfactant, a sulfonate, a phosphonate, a carboxylate, an amino acid derivative (e.g., a fatty acid amino acid amide), a phosphate ester, an isethionate, a sulfate, a sulfosuccinate, a sulfocinnimate, or any combination thereof, (d) an oxidizing agent, and (e) an aqueous carrier, as described herein.

In particular, the invention further provides a method of polishing a substrate comprising: (i) providing a substrate, wherein the substrate comprises a cobalt layer; (ii) providing a polishing pad; (iii) providing the chemical-mechanical polishing composition; (iv) contacting the substrate with the polishing pad and the chemical-mechanical polishing composition; and (v) moving the polishing pad and the chemical-mechanical polishing composition relative to the substrate to abrade at least a portion of the cobalt layer to polish the substrate. The polishing composition comprises, consists, or consists essentially of (a) an abrasive comprising anionic particles, (b) a rate accelerator, (c) a corrosion inhibitor comprising an amphoteric surfactant, a sulfonate, a phosphonate, a carboxylate, an amino acid derivative (e.g., a fatty acid amino acid amide), a phosphate ester, an isethionate, a sulfate, a sulfosuccinate, a sulfocinnimate, or any combination thereof, (d) an oxidizing agent, and (e) an aqueous carrier, as described herein.

The polishing methods and compositions of the invention are useful for polishing any suitable substrate. The polishing methods and composition are particularly useful in the polishing of a substrate layer comprising, consisting essentially of, or consisting of cobalt. Suitable substrates include, but are not limited to, flat panel displays, integrated circuits, memory or rigid disks, metals, semiconductors, inter-layer dielectric (ILD) devices, microelectromechanical systems (MEMS), ferroelectrics, and magnetic heads. The substrate can further comprise at least one other layer, e.g., an insulating layer. The insulating layer can be a metal oxide, porous metal oxide, glass, organic polymer, fluorinated organic polymer, or any other suitable high or low-κ insulating layer, e.g., black diamond (BD). The insulating layer can comprise, consist essentially of, or consist of silicon oxide, silicon nitride, or combinations thereof. The silicon oxide layer can comprise, consist essentially of, or consist of any suitable silicon oxide, many of which are known in the art. For example, the silicon oxide layer can comprise tetraethoxysilane (TEOS), high density plasma (HDP) oxide, borophosphosilicate glass (BPSG), high aspect ratio process (HARP) oxide, spin on dielectric (SOD) oxide, chemical vapor deposition (CVD) oxide, plasma-enhanced tetraethyl ortho silicate (PETEOS), thermal oxide, or undoped silicate glass. The substrate can further comprise a metal layer. The metal can comprise, consist essentially of, or consist of any suitable metal, many of which are known in the art, such as, for example, cobalt, copper, tantalum, tantalum nitride, tungsten, titanium, titanium nitride, platinum, ruthenium, iridium, aluminum, nickel, or combinations thereof.

In accordance with the invention, a substrate can be planarized or polished with the polishing composition described herein by any suitable technique. The polishing method of the invention is particularly suited for use in conjunction with a chemical-mechanical polishing (CMP) apparatus. Typically, the CMP apparatus comprises a platen, which, when in use, is in motion and has a velocity that results from orbital, linear, or circular motion, a polishing pad in contact with the platen and moving with the platen when in motion, and a carrier that holds a substrate to be polished by contacting and moving relative to the surface of the polishing pad. The polishing of the substrate takes place by the substrate being placed in contact with a polishing composition of the invention and typically a polishing pad and then abrading at least a portion of the surface of the substrate, e.g., the cobalt, or one or more of the substrate materials described herein, with the polishing composition and typically the polishing pad to polish the substrate. Any suitable polishing conditions can be used to polish a substrate according to the invention.

A substrate can be planarized or polished with the chemical-mechanical polishing composition with any suitable polishing pad (e.g., polishing surface). Suitable polishing pads include, for example, woven and non-woven polishing pads. Moreover, suitable polishing pads can comprise any suitable polymer of varying density, hardness, thickness, compressibility, ability to rebound upon compression, and compression modulus. Suitable polymers include, for example, polyvinylchloride, polyvinylfluoride, nylon, fluorocarbon, polycarbonate, polyester, polyacrylate, polyether, polyethylene, polyamide, polyurethane, polystyrene, polypropylene, polyisocyanurate, coformed products thereof, and mixtures thereof.

Desirably, the CMP apparatus further comprises an in situ polishing endpoint detection system, many of which are known in the art. Techniques for inspecting and monitoring the polishing process by analyzing light or other radiation reflected from a surface of the workpiece are known in the art. Such methods are described, for example, in U.S. Pat. Nos. 5,196,353, 5,433,651, 5,609,511, 5,643,046, 5,658,183, 5,730,642, 5,838,447, 5,872,633, 5,893,796, 5,949,927, and U.S. Pat. No. 5,964,643. Desirably, the inspection or monitoring of the progress of the polishing process with respect to a workpiece being polished enables the determination of the polishing end-point, i.e., the determination of when to terminate the polishing process with respect to a particular workpiece.

The following examples further illustrate the invention but, of course, should not be construed as in any way limiting its scope.

EXAMPLE 1

This example demonstrates corrosion inhibitor efficacy for inhibitor compositions under aggressive environmental conditions. In particular, static etch rates (SER) of cobalt (Co) substrates were measured after being exposed to various inhibitor solutions across a range of pH's, in comparison to a control solution that was absent an inhibitor. Static etching is a technique that demonstrates the magnitude of cobalt dissolution in water at the tested pH level, and high values are undesirable. Potassium sulfate ($K_2SO_4$) was also included in the solutions where additional corrosivity was needed, i.e., at pH above 3, to provide the desired aggressive environmental conditions.

Cobalt wafers prepared by physical vapor deposition (PVD) having a thickness of 2000 Å were obtained from Silyb Wafer Services, Inc., Gig Harbor, Wash., with a deposition scheme of cobalt on titanium (Ti) on silicon dioxide ($SiO_2$) on silicon. The cobalt wafers were sectioned into 2 cm by 2 cm squares.

The cobalt squares were exposed in solutions adjusted to four different pH's (3.0, 5.0, 7.0, and 9.0, respectively), for five minutes each. The solutions were made with aggressive buffering agents to maintain the pH and potassium sulfate where needed to establish the aggressive conditions. It will be understood that potassium sulfate imparts aggressive corrosive conditions because it is a nonpassivating salt resulting in static etch rates greater than 200 Å/min.

Each test solution was added to a 50 mL beaker, where 40 grams of each solution (without hydrogen peroxide) was weighed and placed in a water bath at 35° C. After each solution equilibrated to 35° C., hydrogen peroxide was added, and the solutions were allowed to equilibrate again. The solutions used to establish corrosive conditions for testing the effectiveness of inhibitors are set forth in Table 2, and the different corrosion inhibitors utilized with each test buffer are set forth in Table 3. The corrosion inhibitor test solutions were made by simple mixing of buffer and inhibitor concentrated solutions.

TABLE 2

| Inhibitor Composition | pH | Buffer | Salt | pH Adjust Acid/base | Final Inhibitor (mM) | $H_2O_2$ (wt. %) |
|---|---|---|---|---|---|---|
| 1A | 3.0 | 20 mM β-alanine | None | $HNO_3$ | 0.35 | 1.00 |
| 1B | 5.0 | 40 mM picolinic acid | 10 mM $K_2SO_4$ | KOH | 0.35 | 1.00 |
| 1C | 7.0 | 40 mM L-histidine | 10 mM $K_2SO_4$ | $HNO_3$ | 0.35 | 1.00 |
| 1D | 9.0 | 40 mM L-histidine | 10 mM $K_2SO_4$ | KOH | 0.35 | 1.00 |

An OmniMap "RS-75" instrument, commercially available from KLA-Tencor Corporation, Milpitas, Calif., was used to measure cobalt thickness before and after exposure. The thickness change was used to calculate the static etch rate (SER), which is reported in Å/minute in Table 3 for each inhibitor (where soluble) as a function of pH.

Table 3 shows the SER of the PVD cobalt squares after the exposure to each inhibitor solution at various pH levels. As shown in Table 3, "NT" indicates not tested; "IS" indicates insoluble; and "high" indicates that the sample was corroded to a high degree but, because of the high level of corrosion, the instrument (i.e., "RS-75" noted above) did not provide a precise reading. The values are compared to the control, which provide a baseline value for comparative purposes. The average SER values set forth in Table 3 were achieved by generally averaging two data points.

TABLE 3

| | | Average SER (Å/minute) | | | |
|---|---|---|---|---|---|
| Inhibitor | Example | pH 3 | pH 5 | pH 7 | pH 9 |
| N-cocoyl sarcosinate | Invention | 46 | 26 | 69 | 29 |
| N-oleoyl sarcosinate | Invention | 12 | 10 | 1 | 14 |
| N-stearoyl sarcosinate | Invention | 1 | 62 | 0 | 32 |
| N-myristoyl sarcosinate | Invention | 15 | 20 | 16 | 120 |
| N-lauroyl sarcosinate | Invention | 8 | 74 | 412 | NT |
| sarcosine | Comparison | NT | 413 | high | 408 |
| N-lauroyl glycine | Invention | NT | 413 | 408 | 374 |
| N-benzoyl glycine | Comparison | NT | 412 | 412 | high |
| N-myristoyl glycine | Invention | IS | IS | 7 | 29 |
| N-palmitoyl glycine | Invention | IS | IS | IS | IS |
| N-phthaloyl-glycine | Comparison | NT | 412 | 409 | 412 |
| glycine | Comparison | NT | 410 | high | 409 |
| decanoic acid | Comparison | NT | 412 | high | 406 |
| dodecanoic acid | Invention | IS | IS | high | 335 |
| myristic acid | Invention | IS | IS | 47 | 13 |
| palmitic acid | Invention | IS | IS | IS | IS |
| acetic acid | Comparison | NT | 410 | high | 409 |
| N-lauroyl glutamate | Invention | 9 | 24 | high | 271 |
| N-cocoyl glutamate, potassium + salt | Invention | IS | 7 | 94 | 112 |
| octylphosphonic acid | Comparison | NT | 414 | 410 | NT |
| tetradecylphosphonic acid | Invention | IS | IS | 106 | 58 |
| hexadecylphosphonic acid | Comparison | IS | IS | high | high |
| 1-hexadecanesulfonic acid sodium salt | Comparison | IS | IS | IS | IS |
| sodium olefin sulfonate | Invention | 129 | 102 | 178 | 336 |
| tetradecylamine | Comparison | 247 | IS | IS | IS |
| hexadecyltrimethyl-ammonium bromide | Comparison | NT | 413 | 411 | high |
| benzotriazole | Comparison | NT | 412 | high | high |
| no inhibitor (control) | Comparison | 258 | 414 | 414 | 409 |

Inhibitors that effectively suppress cobalt etching provide lower values inasmuch as less cobalt is dissolved, as desired. As is apparent from the data set forth in Table 3, even under the aggressive conditions set forth in this experiment, sarcosinates desirably demonstrate low average SER values at all pH's, far below the results shown by the control, with most values less than half of the control (e.g., 120, or lower, with many values much lower). In addition, the data set forth in Table 3 demonstrates that BTA is an ineffective corrosion inhibitor for cobalt in at least some embodiments.

Furthermore, as is apparent from the data set forth in Table 3, surfactants containing a carboxylate group with an aliphatic chain length above twelve-carbons showed considerable cobalt corrosion inhibition (≥70% reduction in SER, compared with the control). Glutamates and sarcosinates with a chain length of at least twelve-carbons were primarily effective at low pH (3 and 5). While not wishing to be bound by any particular theory, it is believed that this effect may be due to the charge attraction between the anionic head group and a positive cobalt oxide-hydroxide surface at these pH levels. It is further believed that the isoelectric point determination (IEP) of cobalt oxides is about 7-9, and thus at pH greater than 9 the action of these inhibitors will be less effective. While again not wishing to be bound by any particular theory, it is noted that anionic head groups are attracted to the cationic cobalt surface below about pH 9, allowing the formation of a passivating layer of anionic surfactant on the cobalt surface.

As is further apparent from the data set forth in Table 3, sulfonate and phosphonate head groups provide significant corrosion inhibition, suggesting inhibition can be achieved relatively independent of the anionic head group. Sodium olefin sulfonate showed variable behavior possibly due to solubility issues. Low solubility of sulfonate surfactants was observed. 1-hexadecanesulfonic acid sodium salt was less soluble than other molar/chain length equivalent surfactants under many conditions. In addition, the critical micelle concentration for the sodium olefin sulfonate (<1 mM) is lower than that of tested sarcosinates (3-15 mM). The low solubility and critical micelle concentration might be responsible for the variability in inhibition efficacy due to a reduction in the active inhibitor available for cobalt inhibition.

It will be appreciated that many practical applications do not require exposure to such aggressive conditions in use. Thus, it will be understood that the conditions set forth in the experiments of this example may not be indicative of common conditions resembling actual practice of some embodiments. For example, in the semiconductor wafer industry, the aggressive conditions set forth in this example may not be typical.

While not wishing to be bound by any particular theory, for aggressive conditions, however, the lack of performance by the amine may indicate that an anionic head group is beneficial. This suggests that there is possible charge repulsion between cationic surfactants and the cobalt surface. The mechanism of inhibition by these molecules is believed to occur via coordination of the anionic group with the surface of cobalt followed by alignment of the hydrophobic tails thereby protecting cobalt from subsequent oxidation.

In accordance with some embodiments, particularly with respect to aggressive conditions, inhibitors containing an aliphatic chain length of at least fourteen carbons can be useful in some embodiments for efficient surface adsorption and cobalt corrosion inhibition. The corrosion inhibitor can be considered a surfactant in some embodiments because it has a hydrophilic head group and hydrophobic tail rendering it surface active. Aromatic groups alone did not offer cobalt inhibition in some embodiments, particularly under these aggressive conditions, possibly due to the lower amount of hydrophobic character or less efficient packing relative to long, saturated aliphatic chains.

EXAMPLE 2

This example demonstrates corrosion inhibitor efficacy for inhibitor compositions under environmental conditions that were less aggressive than the conditions of Example 1. In particular, SER experiments were conducted as set forth in Example 1, except that potassium sulfate salt was not included in any of the solutions.

Table 4 sets forth the SER for selected inhibitor solutions under similar test procedures and conditions as previously described in Example 1, but without the added potassium sulfate ($K_2SO_4$) salt.

TABLE 4

| Inhibitor | Average SER (Å/min) | | | |
|---|---|---|---|---|
| | pH 3 | pH 5 | pH 7 | pH 9 |
| N-lauroyl sarcosinate | NT | 6 | 13 | NT |
| tetradecylphosphonic acid | IS | IS | 1 | NT |
| sodium olefin sulfonate | NT | 37 | 5 | NT |
| dodecanoic Acid | IS | IS | 1 | NT |
| N-benzoyl glycine | NT | 165 | NT | NT |
| hexadecyltrimethylammonium bromide | NT | NT | NT | 6 |
| none (control) | NT | 223 | 193 | 5 |

These results demonstrate that surfactants that had previously been ineffective as corrosion inhibitors under the aggressive conditions of Example 1 were effective under different, less aggressive, conditions. Examples include N-lauroyl ($C_{12}$) sarcosinate and dodecanoic ($C_{12}$) acid, which showed significantly reduced SER compared to the no-inhibitor control. Additionally, phosphonates and sulfonates demonstrated low SER, which further supports the relative independence of the head group requirement. However, benzoyl glycine was still not effective, even in the less aggressive conditions, indicating that a benzene ring alone is not a sufficient tail for inhibition. Additionally, the quaternary amine was unable to be distinguished from control at pH 9 since the overall rates on the control were low due to cobalt passivation at alkaline pH.

These results further demonstrate that certain chain length requirements as described in Example 1 under more aggressive environmental conditions were not necessary under less aggressive environmental conditions.

EXAMPLE 3

This example demonstrates the role of dose dependence on corrosion inhibitor efficacy for various sarcosinate inhibitor compositions under aggressive conditions.

In particular, SER experiments were performed by exposing a small piece of PVD cobalt wafer as described in Example 1 to an inhibitor composition at 35° C. for 5 minutes. The inhibitor composition was in the form of a solution at a pH of 7 and included 40 mM L-histidine, 10 mM potassium sulfate, and one of five different sarcosinate inhibitors, as identified in FIG. 1, which is a graph of static etch rate (SER) (Y-axis) versus inhibitor concentration (μM) of various sarcosinate compounds (X-axis). The SER was determined in Å/min by comparing the thickness of the cobalt wafer before and after the SER test. Without any inhibitor under these conditions, the average SER was 414 Å/min as seen in Table 3.

With reference to FIG. 1, it will be understood that the compositions with the different sarcosinate inhibitors as tested were as follows. Composition 3A included N-lauroyl sarcosinate, which has 12 carbons in the aliphatic chain; composition 3B included N-cocoyl sarcosinate, which is derived from natural products exhibiting a mixture of sarcosinates having 10 and 20 carbons in the aliphatic chain; composition 3C included N-myristoyl sarcosinate, which has 14 carbons in the aliphatic chain; composition 3D included N-stearoyl sarcosinate, which has 18 carbons in the aliphatic chain; and composition 3E included N-oleoyl sarcosinate, which has 18 carbons in the aliphatic chain. L-histidine, which is an example of a chelating agent and rate accelerator, was included in each inhibitor composition as a pH buffer and to increase corrosion. As explained in Example 1, potassium sulfate was included in each inhibitor composition to provide an aggressive environmental condition. The pH of 7 was achieved by base addition.

As is apparent from FIG. 1, these results demonstrate that, at lower concentrations, the sarcosinates containing less than fourteen carbons can tend to lose their inhibitive abilities under aggressive conditions, as manifested in an SER value of about 400 Å/min. In addition, it can be seen that, as the concentration of the N-lauroyl sarcosinate is increased, the cobalt SER is reduced. In addition, for example, oleoyl sarcosinate is effective at a lower concentration of 200-300 micromolar, whereas lauroyl sarcosinate gains effectiveness at the higher concentrations of 400-750 micromolar, as seen in FIG. 1. This is believed to reflect the greater effectiveness of the longer chain length materials under aggressive environmental conditions (which, as indicated in Example 1, may not be indicative of practical conditions). The stearoyl inhibitor, with its longer chain, is effective at lower dosage levels, e.g., less than 300 micromolar, and more completely protects the cobalt surface against dissolving.

Thus, these results demonstrate that, under aggressive conditions in particular, longer chain anionic surfactants can provide desirable protection against corrosion. Such corrosion inhibition occurs at a lower dose requirement to provide the desired passivation, whereas a shorter chain anionic surfactant such as the lauroyl inhibitor will need higher dosage to get the same level of inhibition. While not wishing to be bound by any particular theory, this may be due to relative hydrophobicity because of the stronger hydrophobic chain associations for longer aliphatic chain surfactants.

EXAMPLE 4

This example demonstrates that polishing compositions that include various corrosion inhibitors provided effective cobalt removal rates.

Cobalt PDV substrates were prepared as squares (4 cm by 4 cm). The cobalt substrates were polished with eight chemical-mechanical polishing (CMP) compositions (identified as Compositions 4A-4H in FIG. 2). Each of the polishing compositions contained 0.5 wt. % anionic colloidal silica, 1 wt. % hydrogen peroxide, 0.54 wt. % iminodiacetic acid, 0.042 wt. % bis-tris, water, and was formulated at a pH of 7. The silica was the abrasive, the hydrogen peroxide was the oxidizer, and the iminodiacetic acid was present as an accelerator, while the bis-tris served as a buffer. The polishing compositions differed from each other with respect to the presence of a corrosion inhibitor. Composition 4A was a control and included no corrosion inhibitor, which was used as a baseline for comparative purposes. The remaining compositions included 352 micromolar of a different corrosion inhibitor in each composition. Particularly, composition 4B included N-cocoyl sarcosinate. Composition 4C included N-lauroyl sarcosinate. Composition 4D included N-oleoyl sarcosinate. Composition 4E included N-stearoyl sarcosinate. Composition 4F included N-myristoyl sarcosinate. Composition 4G included dodecanoic acid. Composition 4H included myristic acid.

The substrates were polished on a chemical delayering and planarization (CDP) polishing apparatus commercially available from Logitech International S.A., Lausanne, Switzerland, with a 10.3 kPa (1.5 psi) downforce pressure of the substrate against an IC1010 polishing pad commercially available from Dow Chemical Company, Midland, Mich., 80 rpm platen speed, and 75 rpm head speed, with a slurry flow rate of 50 mL/minute and using a 3M™ A165 diamond pad conditioner.

Figure 2:
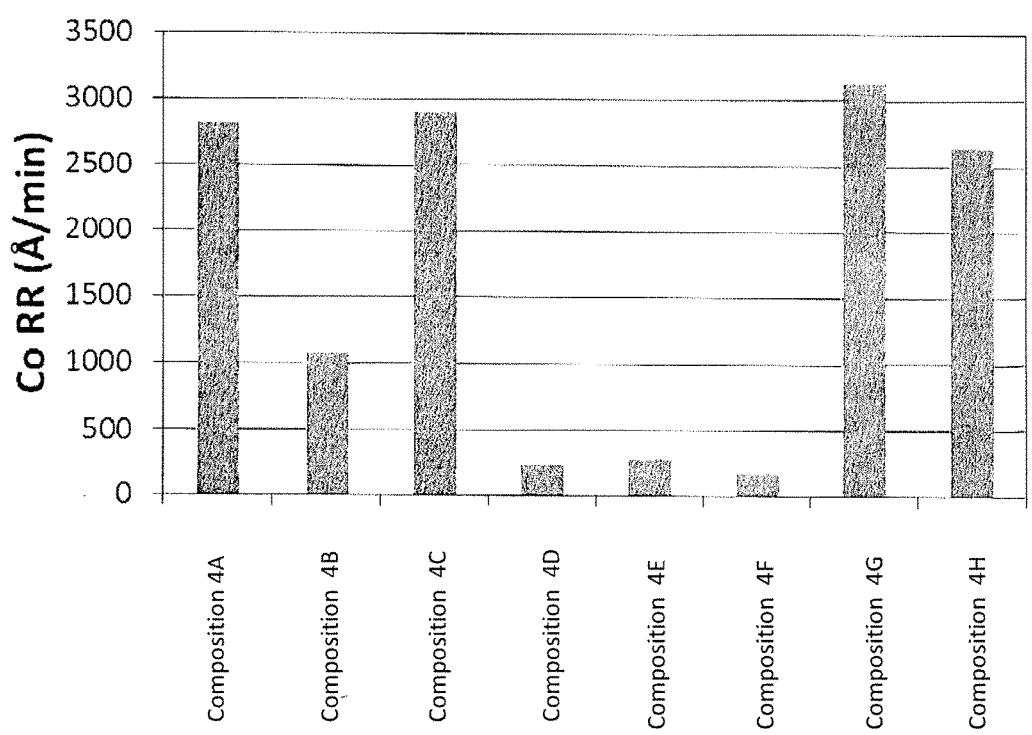
FIG. 2 is a bar graph of cobalt (Co) removal rates (RR) (Y axis) of various corrosion inhibitors (X-axis), as described in Example 4 herein.

As shown in FIG. 2, these results demonstrate that, even with a fixed 352 micromolar concentration of the corrosion inhibitor, the removal rate was relatively similar, compared with the control, for anionic surfactants characterized by an aliphatic chain length less than or equal to twelve. However, it was observed that sarcosinates characterized by aliphatic chain lengths greater than twelve had less effective removal rates. It is believed that chain length affects removal rate under polishing conditions by more effective association at the cobalt or cobalt oxide surface. As seen from FIG. 2, polishing compositions with no inhibitor or with 352 micromolar of N-lauroyl sarcosinate ($C_{12}$), dodecanoic acid ($C_{12}$), and myristic acid ($C_{14}$), the removal rate is unaffected compared with the control (no inhibitor). N-cocoyl sarcosinate which is a mixture of $C_8$, $C_{10}$, $C_{12}$, $C_{14}$, $C_{16}$, $C_{18}$, and $C_{20}$ sarcosinates, shows a significant inhibition at the concentration of 352 micromolar. With the longer chain corrosion inhibitors, particularly, N-oleoyl sarcosinate, N-stearoyl sarcosinate, or N-myristol sarcosinate at the 352 micromolar concentration, the removal rate inhibition is almost complete.

Thus, these results show that cobalt removal rate can be impacted by the corrosion inhibitor, with shorter chain lengths being less detrimental to the removal rate at fixed concentration. The cocoyl sarcosinate, which is a mixture of chain length ($C_{8-20}$), demonstrates an intermediate removal rate, further supporting the importance of the chain length to cobalt removal rate. The formulations containing shorter lengths demonstrated higher cobalt removal rate. In CMP applications, it is desired to have adequate corrosion protection but it can come at the expense of cobalt removal rate at higher corrosion inhibitor concentrations. Balancing the impact of inhibitors decreasing corrosion rate and cobalt removal rate will be formulation and application specific.

EXAMPLE 5

This example demonstrates that polishing compositions that included various corrosion inhibitors provided effective cobalt removal rates.

Figure 3:
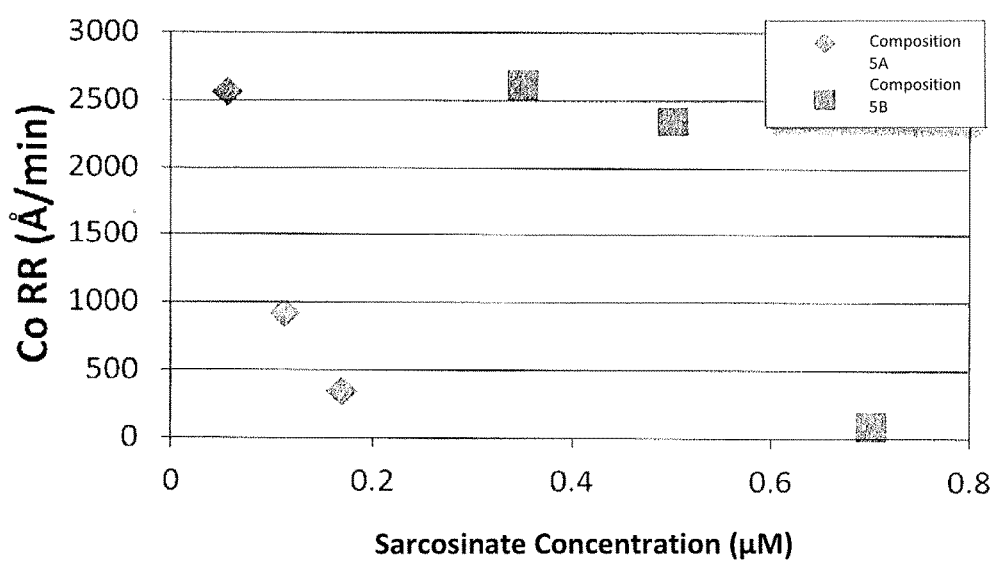
FIG. 3 is a graph of Co removal rates (Y-axis) versus concentration of two sarcosinate corrosion inhibitors (mM) (X-axis), as described in Example 5 herein.

Cobalt PDV substrates were prepared as squares (4 cm by 4 cm). The cobalt substrates were polished with two chemical-mechanical polishing (CMP) compositions (identified as Compositions 5A-5B in FIG. 3). Each of the polishing compositions contained 0.5 wt. % anionic colloidal silica, 0.6 wt. % hydrogen peroxide, 0.6 wt. % iminodiacetic acid, 0.04 wt. % bis-tris, and water, and was formulated at a pH of 7.1. Composition 5A included N-oleoyl sarcosinate, while composition 5B included N-lauroyl sarcosinate. The substrates were polished using instruments as described in Example 4. The results are shown in FIG. 3.

These results demonstrate that cobalt chemical-mechanical polishing removal rate can also be a function of the inhibitor concentration. In particular, these results indicate the effect of two different sarcosinates: N-oleoyl sarcosinate, which is a $C_{18}$ monounsaturated sarcosinate, versus N-lauroyl sarcosinate, which is a $C_{12}$ saturated sarcosinate. The N-oleoyl sarcosinate is found to inhibit cobalt blanket removal rate at concentrations of 100 micromolar and to an even greater extent at 200 micromolar. N-lauroyl sarcosinate needs to reach a concentration of about 750 micromolar before it prevents cobalt from being removed in the CMP experiment. It can be seen that cobalt CMP removal rate and corrosion behavior can be modulated via inhibitor choice (e.g., chain length) and concentration to achieve optimum performance.

EXAMPLE 6

This example demonstrates static etch rates at pH 7 for selected inhibitor solutions under test procedures and conditions previously described in Example 1, but with the added potassium sulfate ($K_2SO_4$) salt at 0.02 mM concentrations. Solutions without inhibitor or with BTA in varying concentrations were compared with a solution containing N-lauroyl sarcosinate. The tested inhibitor solutions are set forth in Table 5.

TABLE 5

| Inhibitor | Average SER (Å/min) pH 7 |
|---|---|
| No Inhibitor | 320 |
| 0.35 mM BTA | 314 |
| 2 mM BTA | 339 |
| 5 mM BTA | 314 |
| 0.35 mM N-lauroyl sarcosinate | 14 |

The results demonstrate that BTA alone is ineffective at mitigating cobalt static etch rate even at concentrations ten times greater than an effective dosage of N-lauroyl sarcosinate.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the invention (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A chemical-mechanical polishing composition comprising:
    (a) an abrasive comprising colloidal silica particles,
    (b) a rate accelerator comprising a phosphonic acid, an N-heterocyclic compound, or a combination thereof,
    (c) a corrosion inhibitor comprising an amino acid derivative, wherein the amino acid derivative is N-cocoyl sarcosinate, N-lauroyl sarcosinate, N-stearoyl sarcosinate, N-oleoyl sarcosinate, N-myristoyl sarcosinate, or any combination thereof; wherein the inhibitor is present in an amount of from about 0.004 wt. % to about 0.010 wt. %,
    (d) an oxidizing agent, and
    (e) an aqueous carrier, wherein the polishing composition is substantially free of an aromatic azole, and
    the pH of the polishing composition is about 3 to about 8.5.

2. The chemical-mechanical polishing composition of claim 1, wherein the oxidizing agent is a compound that oxidizes cobalt.

3. The chemical-mechanical polishing composition of claim 1, wherein the colloidal silica particles are anionic colloidal silica particles.

4. A method of polishing a substrate comprising:
    (i) providing a substrate, wherein the substrate comprises a cobalt layer;
    (ii) providing a polishing pad;
    (iii) providing the chemical-mechanical polishing composition of claim 1;
    (iv) contacting the substrate with the polishing pad and the chemical-mechanical polishing composition; and
    (v) moving the polishing pad and the chemical-mechanical polishing composition relative to the substrate to abrade at least a portion of the cobalt layer to polish the substrate.

* * * * *